United States Patent [19]

Wei

[11] Patent Number: 5,173,450
[45] Date of Patent: Dec. 22, 1992

[54] TITANIUM SILICIDE LOCAL INTERCONNECT PROCESS

[75] Inventor: Che-Chia Wei, Plano, Tex.

[73] Assignee: Texas Instruments Incorporated, Dallas, Tex.

[21] Appl. No.: 816,022

[22] Filed: Dec. 20, 1991

[51] Int. Cl.$^5$ ......................................... H01L 21/283
[52] U.S. Cl. ..................................... 437/200; 437/52; 437/190; 437/193; 437/41; 148/DIG. 19
[58] Field of Search ................. 437/200, 52, 201, 193, 437/191, 192, 190; 148/DIG. 19, DIG. 20, DIG. 1, DIG. 147; 1/41

[56] References Cited

U.S. PATENT DOCUMENTS

| | | | |
|---|---|---|---|
| 4,589,196 | 5/1986 | Anderson | 148/DIG. 147 |
| 4,751,198 | 6/1988 | Anderson | 437/200 |
| 4,873,204 | 10/1989 | Wong et al. | 437/200 |
| 4,962,060 | 10/1990 | Sliwa et al. | 437/192 |
| 4,994,402 | 2/1991 | Chiu | 437/41 |

OTHER PUBLICATIONS

Chen, et al., "A New Device Interconnect Scheme for Submicron VLSI," IEEE IEDM 1984, pp. 118-121.
de Werdt, et al., "A 1M SRAM with Full CMOS Cell Fabricated . . . ", IEEE IEDM 1987, pp. 532-535.

Primary Examiner—T. N. Quach
Attorney, Agent, or Firm—Stanton C. Braden; Richard L. Donaldson; William E. Hiller

[57] ABSTRACT

A $TiSi_2$ LI process solves the problems of poor junction integrity and rapid dopant outdiffusion by adding a second titanium deposition on the amorphous silicon/titanium stack and reducing the initial titanium thickness to its minimum required value for amorphous silicon etch stop. Referring to FIG. 5 of the drawings, titanium layer 60 reacts at exterior surface 58 of sidewall oxide 59 to form TiN layer 57. Layer 57 acts to stop outdiffusion of silicon into the second titanium layer 60. This second titanium deposition on the amorphous silicon/titanium stack minimizes differential $TiSi_2$ formations because the silicon selected in $TiSi_2$ formation originates from amorphous silicon layer 54, rather than from the source region 22 or drain region 23, resulting in better junction integrity. This process saves up to 25% of the area otherwise required in contacts for SRAMS, yielding much improved packing density. Because several devices can share one contact when they need to communicate, the total number of contacts can be greatly reduced. The $TiSi_2$ LI process of the invention avoids junction integrity problems and rapid dopant outdiffusion.

17 Claims, 3 Drawing Sheets

5,173,450

TITANIUM SILICIDE LOCAL INTERCONNECT PROCESS

TECHNICAL FIELD OF THE INVENTION

The present invention relates to electronic semiconductor devices, and, more particularly, to an improved titanium silicide ($TiSi_2$) local interconnect (LI) process.

BACKGROUND OF THE INVENTION

Efficient manufacture of submicron very large scale integration (VLSI) circuits includes the need for increased packing density, reduced device parasitics, low resistivity interconnects and high resolution lithography. Various buried contact and self-aligned contact schemes have been developed to increase the number of devices per unit area, avoid the necessity of defining small contacts and relax alignment tolerances. Silicides have been increasingly used to reduce device parasitic resistances as well as interconnect resistances.

Polycrystalline silicon (poly) gates conventionally have been connected to source and drain regions through the use of metal. Metal has many design limitations including interlevel oxide formation and capacitance concerns. Metal is difficult to deposit and etch, resulting in the large allowances required for possible misalignment. Because metal is hard to process into useful contacts, the prior art has suggested reducing the design rule pressure on the metal by adding a second metal level. The problem with this suggested solution is that this secondary metal is even more sensitive to design rule constraints. Metal, therefore, is a limiting factor. Local interconnect (LI) was invented to connect certain poly gates to certain active semiconductor regions without using metal one in the contact to the poly.

Titanium silicide technology implemented in local interconnects (LI) is of particular interest for application in fast logic circuits and also benefits the full complementary metal-oxide semiconductor (CMOS) static random access memory (SRAM), since substrate and well contacts can be made to every cell without sacrificing area. Titanium silicide has been proposed to be used as LI material in self-aligned titanium silicide technology. See Philips, *A 1M SRAM With Full CMOS Cells Fabricated In A 0.7 $\mu M$ Technology* (1987); Hewlett Packard, *A New Device Interconnect Scheme For Sub-Micron VLSI* (1984). The titanium silicide LI provides the flexibility to extend the junction area for self-registered contacts to further increase packing density. As published in the literature, this titanium silicide LI process includes successive depositions of titanium and amorphous silicon (a-Si), an LI pattern and an amorphous silicon etch, a titanium silicide reaction and an anneal. However, due to rapid dopant outdiffusion and, more importantly, the differential titanium silicide formation on single crystal Si, poly-Si and amorphous silicon, this technology can be used only with some additional design rule constraints such as between n+poly-to-p+junction which are connected by LI to preserve gate oxide integrity (GOI) and junction integrity. The rapid dopant outdiffusion through $TiSi_2$, places limits on certain processing windows, such as thermal steps. Accordingly, such design rule constraints limit the usefulness of this process in high density VLSI circuits because a greater distance between LI connecting points means that the manufacture requires greater area. It has therefore become desirable to devise an improved titanium silicide LI process which can be fabricated without sacrificing area and which provides a longer window of processing time than those presently existing in the art.

SUMMARY OF THE INVENTION

According to the invention, an improved titanium silicide local interconnect process is formed on an integrated circuit workpiece. A first layer of metal to be silicided is deposited on the workpiece and extends laterally between two points on the face of the workpiece. A layer of elemental silicon is formed over the first layer of metal. A second layer of the metal to be silicided is formed on the layer of elemental silicon. The workpiece is then placed under a nitrogen atmosphere to react the first layer of metal and the second layer of metal with the layer of elemental silicon to create a metal silicide interconnect conductor.

One technical advantage of the invention is that conventional titanium silicide LI problems are solved by adding another titanium deposition on the amorphous silicon/titanium stack. Deposition thickness of the initial titanium layer is also reduced to its minimum required value for an amorphous silicon etch stop.

Another technical advantage of the present invention include is minimization of differential $TiSi_2$ formations, resulting in better junction integrity. One important aspect is that this invention provides is a longer window of processing time than $TiSi_2$ LI processes presently existing in the art.

BRIEF DESCRIPTION OF THE DRAWINGS

Other aspects of the invention and their advantages detailed description as taken in conjunction with the drawings, in which.

DETAILED DESCRIPTION OF THE INVENTION

The preferred embodiment of the present invention is best understood by referring to FIGS. 1 through 9 of the drawings, like numerals being used for like and corresponding parts of the various drawings.

Figure 1:
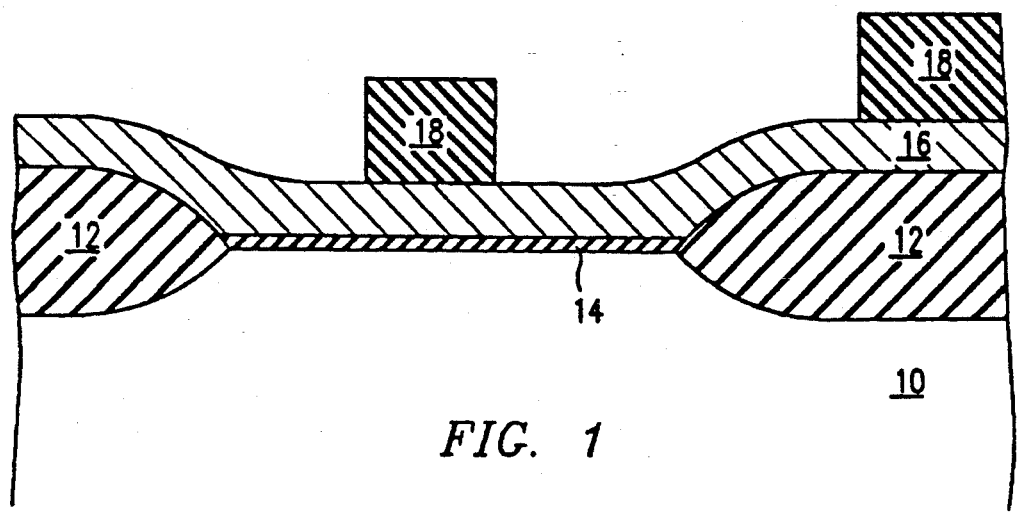
FIGS. 1 and 2 are greatly enlarged schematic elevational sectional views of a semiconductor layer showing progressive stages in the fabrication of a semiconductor device and a nearby poly conductor.
Figure 2:
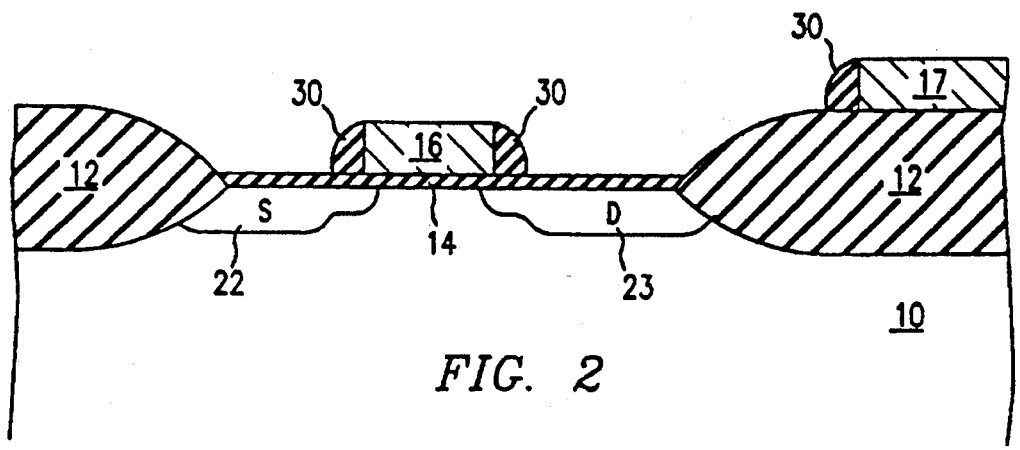

FIGS. 1 and 2 are highly magnified schematic elevational sectional views of progressive stages of fabricating a field effect transistor and a nearby poly conductor. FIG. 1 depicts a portion of a semiconductor substrate or layer 10. The illustrated portion may be a tank which may, for example, be doped (n−). A thick field oxide 12, on the order of 7,000 Å, is grown in selected regions on the face of the substrate 10 using a modified LOCOS or other suitable process, and thereby defining an active device area. A gate oxide layer 14 is next grown on the silicon in the active device area to a thickness of 50–500Å depending on device type and function. This is followed by the deposition of a polycrystalline silicon (poly) layer, for example, to a thickness of approximately 4000Å. Poly layer 16 may be doped in situ with a dopant source such as $POCl_3$ to render it highly conductive. A photoresist pattern 18 is then used to pattern and etch the poly layer 16 and 17. The conductor 17 is designed over one of the thick field oxide regions.

In FIG. 2, the lightly doped drain (LDD) first implant is self-aligned to the lateral edges of poly gate 16 and the bird's beak margins of field oxide regions 12. Next, a relatively thick layer of oxide is deposited, as by means of tetraethylorthosilicate (TEOS) to create a TEOS oxide layer, and etched back to create sidewall oxide features 30. A second source/drain implant is the preformed to create (n+) regions having the approximate pn junction boundaries shown. Both implants are performed with p-type material, such as boron.

Figure 3:
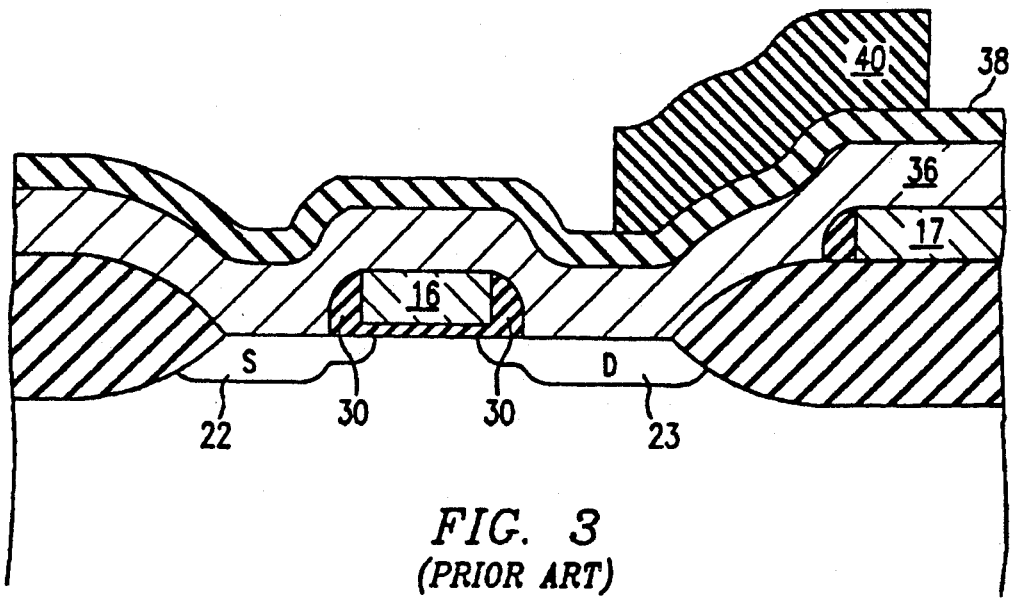
FIGS. 3 and 4 are greatly enlarged schematic elevational sectional views of a semiconductor layer showing the fabrication of a local interconnect conductor according to the prior art.
Figure 4:
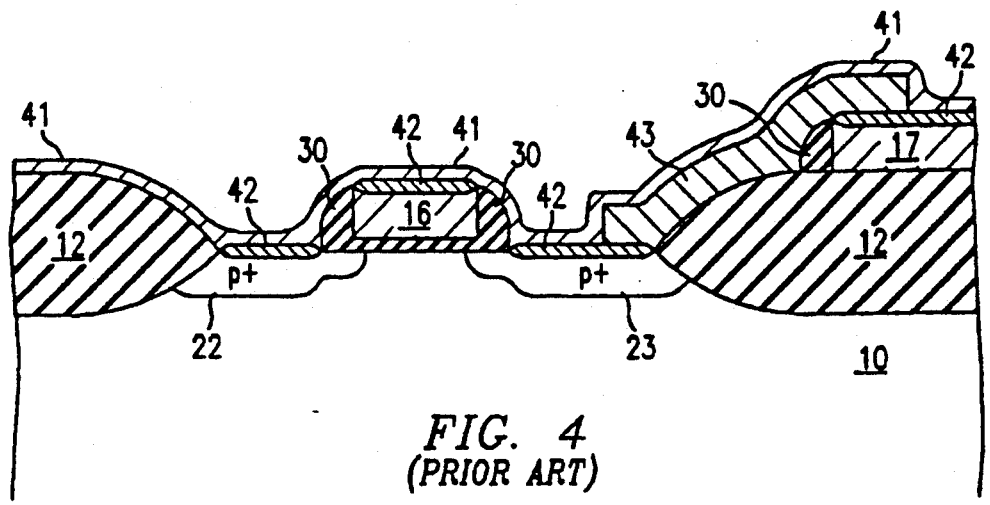

FIGS. 3 and 4 are highly magnified schematic elevational sectional views of a $TiSi_2$ LI process according to the prior art, as forming a local interconnect conductor in connection with the device shown in FIG. 3. After sidewall oxide 30 is formed, a titanium layer 36 as deposited to a thickness of approximately 1000Å, followed by the deposition of an amorphous silicon layer 38 (the entirety of which is shown by the dotted line, prior to etching). The amorphous silicon layer 38 is provided as a source of silicon for the formation of the titanium silicide interconnect. Patterned resist layer 40 is formed and the amorphous silicon layer 38 is etched from all uncovered areas. After a resist strip, the wafer is next exposed to a nitrogen atmosphere for approximately thirty minutes at 675° C.

FIG. 4 shows the results of these last process steps. Titanium silicide layers 42 are formed on the faces of source and drain regions 22 and 23, as well as on the exposed surfaces of the gate 16 and the poly conductor 17. A local interconnect titanium silicide conductor 43 is formed on the surface of field oxide 12 to connect the source/drain region 23 to the conductor 17. A titanium nitride layer 41 is formed over all surfaces.

The conventional local interconnect, shown in FIGURE 4, has had junction integrity problems because the $TiSi_2$ formation preferentially consumes silicon from the poly layer 17 and drain 23 to form silicide layer 43, rather than using amorphous silicon layer 38 as the silicon source. Such affinity causes erosion of drain 23 until spiking through the drain region 23 is possible. Dopant diffuses out with the escaping silicon, but cannot pass through the TiN layer 41; the dopant may instead spread, as from high-doped n-type poly conductor 17, along titanium silicide layer 43 to p-type drain 23, creating pn junction integrity problems. The present invention is a solution to this prior art junction integrity and outdiffusion problem.

Figure 5:
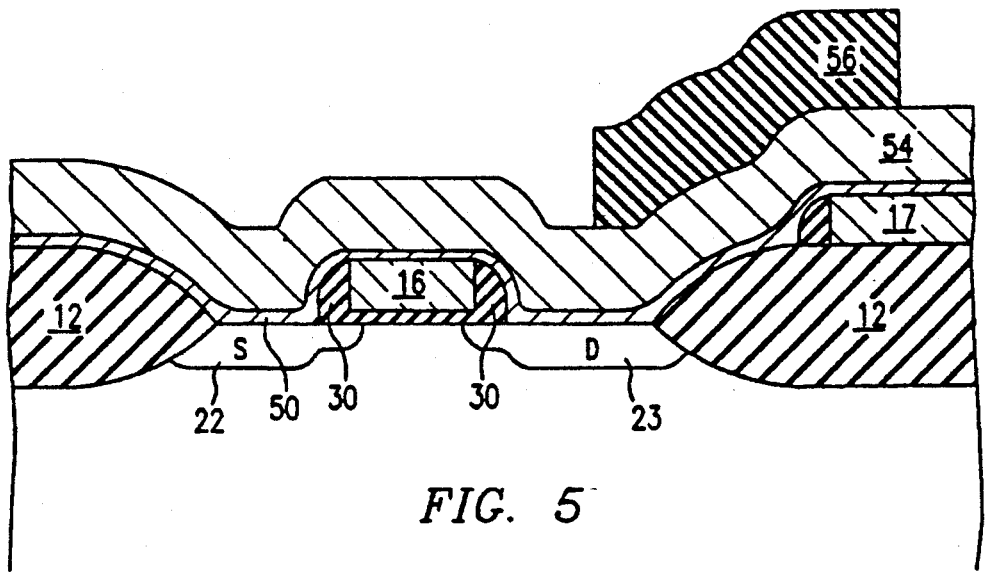
FIGS. 5 through 8 are greatly enlarged schematical elevational sectional views of a semiconductor layer showing subsequent progressive stages in the fabrication of a local interconnect conductor according to the present invention.

FIGS. 5 through 8 show a local interconnect fabrication process according to the invention. Referring first to FIG. 5, a thin, first titanium layer 50 is deposited. Layer 50 need only be thick enough to act as an amorphous silicon etch stop. The thickness of layer 50 is determined by the etch selectivity between the amorphous silicon and titanium; the higher the selectivity, the lower the first titanium thickness. A thickness of approximately 200Å is preferably for layer 50. This is followed by the deposition of an amorphous silicon layer 54 (the entirety of which is shown by the dotted line, prior to etching) to a thickness of approximately 1200Å. Resist layer 56 is then deposited, exposed and developed to pattern the local interconnect, and an etch is performed to remove exposed portions of the amorphous silicon layer 54. The etch stops on the titanium layer 50.

Figure 6:
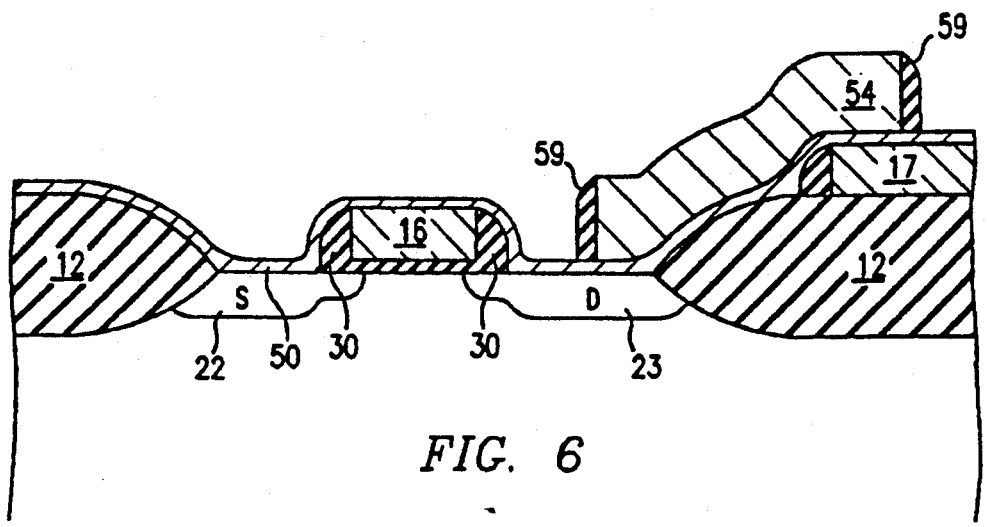

In FIG. 6, the photoresist layer 56 is stripped. In a preferred embodiment an oxide layer (not shown) is deposited to a thickness of approximately 1000Å, followed by an anisotrophic etch, to form sidewall oxide regions 59 on the lateral margins of the amorphous silicon layer 54.

Figure 7:
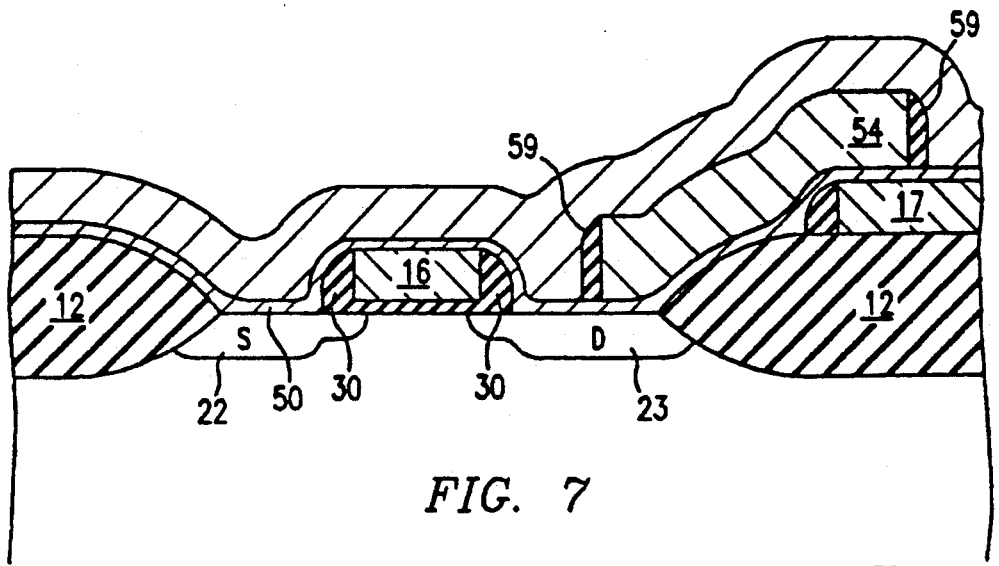

Turning next to FIG. 7, a second titanium layer 60 is deposited. The thickness of layer 60 is determined both by the required total titanium silicide thickness to form low sheet resistance and the thickness of the first titanium layer. Preferably, the second layer 60 is approximately 500Å or greater.

Figure 8:
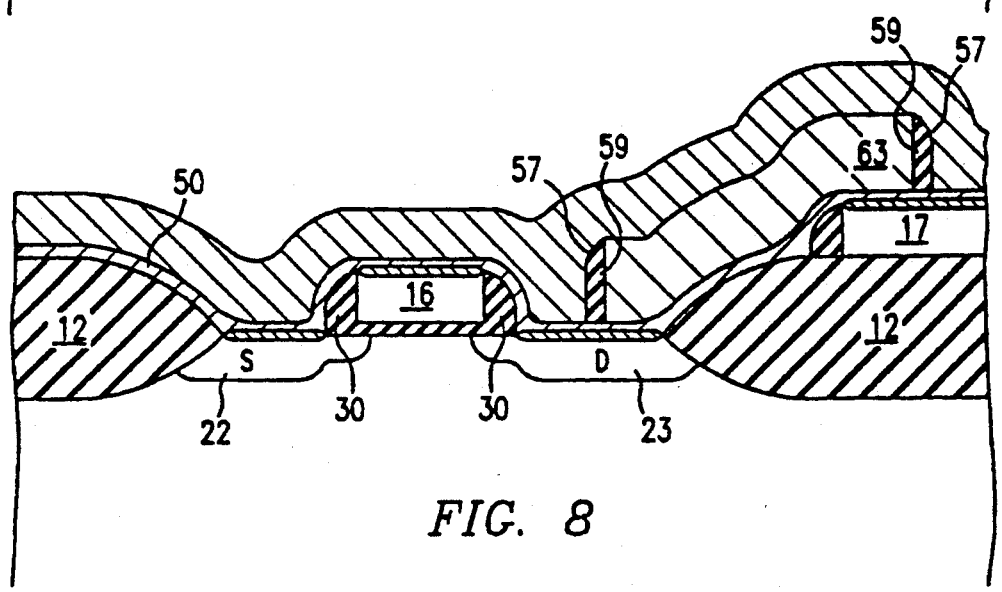

Referring to FIG. 8, the deposition of layer 60 is followed by exposure to a nitrogen atmosphere at a temperature of about 675° C. On sidewall oxide 59 the titanium reacts with the nitrogen to form a TiN layer 57 on exterior surface 58 of sidewall oxide 59 as well as over the remainder of the workpiece; since elemental silicon is not available for reaction with the titanium. Titanium silicide layers 62 are formed on the faces on source and drain regions 22 and 23, as well as on the exposed surfaces of the gate 16 and conductor 17. A local interconnection titanium silicide layer 63 is formed on the surface of field oxide 12 to connect a source/drain region 23 to a poly 17. A wet etch is then performed to strip the unwanted titanium and TiN, and the workpiece is annealed.

The double titanium depositions of the invention force the $TiSi_2$ LI formation to consume amorphous silicon from layer 54 (see FIG. 7) rather than pulling silicon atoms from the adjacent drain region 23 or poly conductor 17. Additionally, the TiN 57 formed on the exterior surface 58 of sidewall oxide 59 acts as a barrier to stop the out-diffusion of silicon into the second titanium layer 60 (see FIG. 7) at time of formation of the titanium silicide. This second titanium deposition on the amorphous silicon/titanium stack minimizes differential $TiSi_2$ formation because the silicon selected for $TiSi_2$ formation originates from amorphous silicon layer 54, rather the from the drain region 23, resulting in better junction integrity.

Figure 9:
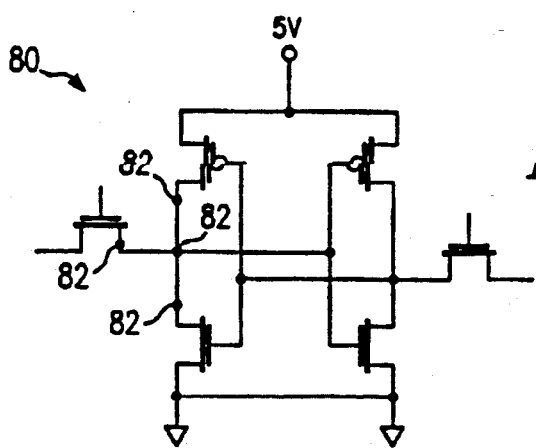
FIG. 9 is a schematic electrical circuit diagram of a static random-access memory (SRAM) cell capable of employing the invention.

FIG. 9 is a schematic functional block diagram of an architecture of a conventional static random-access memory (SRAM) cell indicated generally at 80. Silicon to metal contacts are particularly important in SRAM cells. In particular, points 82 in the SRAM cell 80 are illustrative of critical points at which silicon/metal contacts have to be made. The local interconnect system of the invention may be used with good effect to make these contacts. The local interconnect technology of the invention means that (n+)poly-to-(p+) source/drain local interconnect spacing can be compacted, as the rapid dopant outdiffusion and differential titanium silicide formation problems of the prior art are avoided. The SRAM cell 80 can therefore be packed into a smaller area.

In summary, a novel method of making a titanium silicide interconnect has been shown and described which mitigates the pn junction integrity and source/drain spiking problems associated with conventional local interconnects made using amorphous silicon.

While the preferred embodiment of the invention and their advantages have been set forth in the above detailed description, the invention is not limited thereto but only by the scope and spirit of the appended claims.

What is claimed is:

1. A process for forming a local interconnect conductor on an integrated circuit workpiece, comprising the steps of:
 depositing a first layer of a metal to be silicided to extend between a first point and a second point on a face of an integrated circuit workpiece;
 forming a layer of elemental silicon on the first layer of metal and to extend between the first point and the second point;
 etching the layer of elemental silicon to define the lateral limits of the interconnect conductor to be formed and to form substantially vertical sidewalls of the elemental silicon layer, said lateral limits extending from said first point to said second point on said face of said integrated circuit workpiece;
 forming a sidewall insulator to adjoin each of said sidewalls;
 forming a second layer of said metal to be silicided at least on the layer of elemental silicon; and
 reacting the first layer of metal and the second layer of metal with the layer of elemental silicon to create a metal silicide interconnect conductor between the first point and the second point.

2. The process of claim 1, wherein said layer of elemental silicon comprises amorphous silicon.

3. The process of claim 1, wherein said metal comprises titanium.

4. The process of claim 1, and further comprising the step of using the first layer of metal as an etch stop for said step of etching the layer of elemental silicon.

5. A process for forming a local interconnect conductor on a face of an integrated circuit workpiece, comprising the steps of:
 providing an integrated circuit workpiece with a face having exposed areas of elemental silicon thereon;
 depositing a first layer of metal on the face, the metal selected to be capable of forming a conductive silicide and a nitride;
 Depositing a layer of amorphous silicon on the first layer of metal;
 etching the layer of amorphous silicon to define lateral limits of a local interconnect conductor to be formed;
 depositing a second layer of said metal on the layer of amorphous silicon and on exposed portions of the first layer of said metal;
 reacting, under a nitrogen atmosphere, the metal and the amorphous silicon to create regions of metal silicide on each exposed area of elemental silicon, to create a metal silicide interconnect conductor, and to create metal nitride.

6. The process of claim 5, and further comprising the step of removing unwanted portions of unreacted metal after said step of reacting.

7. The process of claim 5, and further comprising the step of removing unwanted portions of the metal nitride after said step of reacting.

8. The process of claim 5, wherein said metal is titanium.

9. The process of claim 5, wherein the first layer of metal is deposited to a thickness of about 200Å.

10. The process of claim 5, wherein said layer of amorphous silicon is deposited to a thickness of about 1200Å.

11. The process of claim 5, wherein the second layer of metal is deposited to a thickness of not less than about 500Å.

12. A process of forming a local interconnect conductor at a face of a semiconductor workpiece from a portion of a device formed at said face to a conductor spaced from said portion, comprising the steps of:
 forming at least one thick insulator region on the face;
 forming a semiconductor device in an active device area of the workpiece adjacent the thick insulator region, the semiconductor device including a diffused semiconductor region with a diffused region area on the face of the workpiece;
 forming an elemental silicon conductor on the thick insulator region to be laterally spaced from the diffused semiconductor region area;
 depositing a first layer of metal on the face of the workpiece, the metal selected to form a conductive silicide and a nitride;
 depositing a layer of amorphous silicon on the first layer of metal;
 etching the layer of amorphous silicon to define an amorphous silicon local interconnect structure which laterally extends from the diffused region area to the conductor disposed on the thick insulator region;
 depositing a second layer of metal on the amorphous silicon structure and on exposed portions of the first layer of said metal;
 reacting, under a nitrogen atmosphere, the metal and the amorphous silicon interconnect structure to create a metal silicide interconnect conductor which electrically connects the diffused region to the conductor disposed on the thick insulator region, to create metal silicide regions at exposed silicon surfaces of the conductor disposed on the thick insulator region and semiconductor device, and to create a layer of metal nitride over exposed insulator regions, over the metal silicide regions and over the metal silicide interconnect conductor; and
 removing unwanted portions of unreacted metal and metal nitride.

13. The process of claim 12, wherein the first layer of metal is deposited to a thickness of about 200Å.

14. The process of claim 12, wherein the layer of amorphous silicon is deposited to a thickness of approximately about 1200Å.

15. The process of claim 12, wherein the second layer of metal is deposited to a thickness of not less than about 500Å.

16. The process of claim 12, wherein said metal comprises titanium.

17. The process of claim 12, and further comprising the step of forming sidewall insulator regions on sidewalls of the amorphous silicon interconnect structure to prevent dopant outdiffusion from the diffused region into the metal silicide interconnect conductor.

* * * * *

UNITED STATES PATENT AND TRADEMARK OFFICE
CERTIFICATE OF CORRECTION

PATENT NO. : 5,173,450
DATED : December 22, 1992
INVENTOR(S) : Che-Chia Wei It is certified that error appears in the above-identified patent and that said Letters Patent is hereby corrected as shown below:

Title page: Item[21] the filing date "December 20, 1991" should read -- December 30, 1991 --.

Claim 5, column 5, line 44: Replace "Depositing" with -- depositing --.

Signed and Sealed this

Sixteenth Day of November, 1993

Attest:

BRUCE LEHMAN

*Attesting Officer*     *Commissioner of Patents and Trademarks*